United States Patent
Tang et al.

(10) Patent No.: US 10,498,215 B1
(45) Date of Patent: Dec. 3, 2019

(54) VOLTAGE REGULATOR WITH FLEXIBLE OUTPUT VOLTAGE

(71) Applicant: Wuhan Xinxin Semiconductor Manufacturing Co., Ltd., Wuhan, Hubei Province (CN)

(72) Inventors: Yuan Tang, San Jose, CA (US); Jen-Tai Hsu, San Jose, CA (US)

(73) Assignee: Wuhan Xinxin Semiconductor Manufacturing Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/198,775

(22) Filed: Nov. 22, 2018

(51) Int. Cl.
*H02M 1/08* (2006.01)
*H02M 3/158* (2006.01)
*G11C 16/10* (2006.01)
*G11C 16/30* (2006.01)
*H02M 1/00* (2006.01)

(52) U.S. Cl.
CPC .............. *H02M 1/08* (2013.01); *G11C 16/10* (2013.01); *G11C 16/30* (2013.01); *H02M 3/158* (2013.01); *H02M 2001/0025* (2013.01)

(58) Field of Classification Search
CPC .................. H02M 1/08; H02M 3/158; H02M 2001/0025; G11C 16/10; G11C 16/30
See application file for complete search history.

(56) References Cited

U.S. PATENT DOCUMENTS

| | | | | | |
|---|---|---|---|---|---|
| 7,848,167 | B2 * | 12/2010 | Park | ......................... | G05F 1/56 |
| | | | | | 365/189.02 |
| 9,653,126 | B2 * | 5/2017 | Nguyen | ................. | G11C 5/145 |

\* cited by examiner

*Primary Examiner* — Gene N Auduong
(74) *Attorney, Agent, or Firm* — Winston Hsu

(57) ABSTRACT

A voltage regulator includes a first feedback loop and a second feedback loop. The first feedback loop includes a charge pump outputting a first output voltage, a first transistor ladder and a control circuit. The first transistor ladder divides the first output voltage to generate a first feedback voltage. The control circuit receives the first feedback voltage and controls a level of the first output voltage according to the first feedback voltage and a reference voltage. The second feedback loop includes a power transistor, a second transistor ladder and an operational amplifier. The power transistor receives the first output voltage to output a second output voltage. The second transistor ladder divides the second output voltage to generate a second feedback voltage. The operational amplifier outputs a control signal to the power transistor by receiving the second feedback voltage and a reference voltage selected from one of a plurality of levels.

10 Claims, 2 Drawing Sheets

VOLTAGE REGULATOR WITH FLEXIBLE OUTPUT VOLTAGE

BACKGROUND OF THE INVENTION

1. Field of the Invention

The present invention relates to a voltage regulator, and more particularly, to a voltage regulator capable of outputting a flexible output voltage having a wide range of voltage levels.

2. Description of the Prior Art

A voltage regulator is widely applied in a circuit system, for providing a stable and flexible supply voltage to a device or module in the circuit system. In order to generate a desired voltage level, the voltage regulator usually includes a feedback loop formed by a resistor ladder, which divides the output voltage by a preconfigured ratio to generate a feedback voltage, so as to provide a feedback control for the output voltage.

However, there is always a current flowing through the resistor ladder. In order to minimize the current consumption, the resistors should be disposed to have a large resistance value, which occupy a larger area in the circuit layout. Otherwise, more current consumption is unavoidable if disposition of the resistor ladder is limited in a satisfactory area. Therefore, low power and small area cannot be achieved simultaneously.

Further, with increasing applications of various electronic systems, there are many types of circuits required to operate by receiving a supply voltage with a large voltage range. For example, a flash memory may require a supply voltage ranging from 2.3V to 10V for different operations such as programming, reading, and erasing. However, the conventional voltage regulator can only provide a voltage lower than the supply voltage received by the voltage regulator. In order to output a higher voltage such as 10V, a boosting or pumping circuit is usually required, which increases the complexity of the circuit design. Thus, there is a need for improvement over the prior art.

SUMMARY OF THE INVENTION

It is therefore an objective of the present invention to provide a voltage regulator which is capable of outputting a flexible output voltage without the usage of resistors.

An embodiment of the present invention discloses a voltage regulator, which comprises a first feedback loop and a second feedback loop. The first feedback loop comprises a charge pump, a first transistor ladder and a control circuit. The charge pump is configured to output a first output voltage. The first transistor ladder, coupled to the charge pump, is configured to divide the first output voltage to generate a first feedback voltage. The control circuit, coupled to the first transistor ladder, is configured to receive the first feedback voltage and control a level of the first output voltage according to the first feedback voltage and a first reference voltage. The second feedback loop, coupled to the first feedback loop, comprises a power transistor, a second transistor ladder and an operational amplifier. The power transistor is configured to receive the first output voltage to output a second output voltage. The second transistor ladder, coupled to the power transistor, is configured to divide the second output voltage to generate a second feedback voltage. The operational amplifier, coupled to the second transistor ladder and the power transistor, is configured to output a control signal to the power transistor by receiving the second feedback voltage and a second reference voltage selected from one of a plurality of voltage levels.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
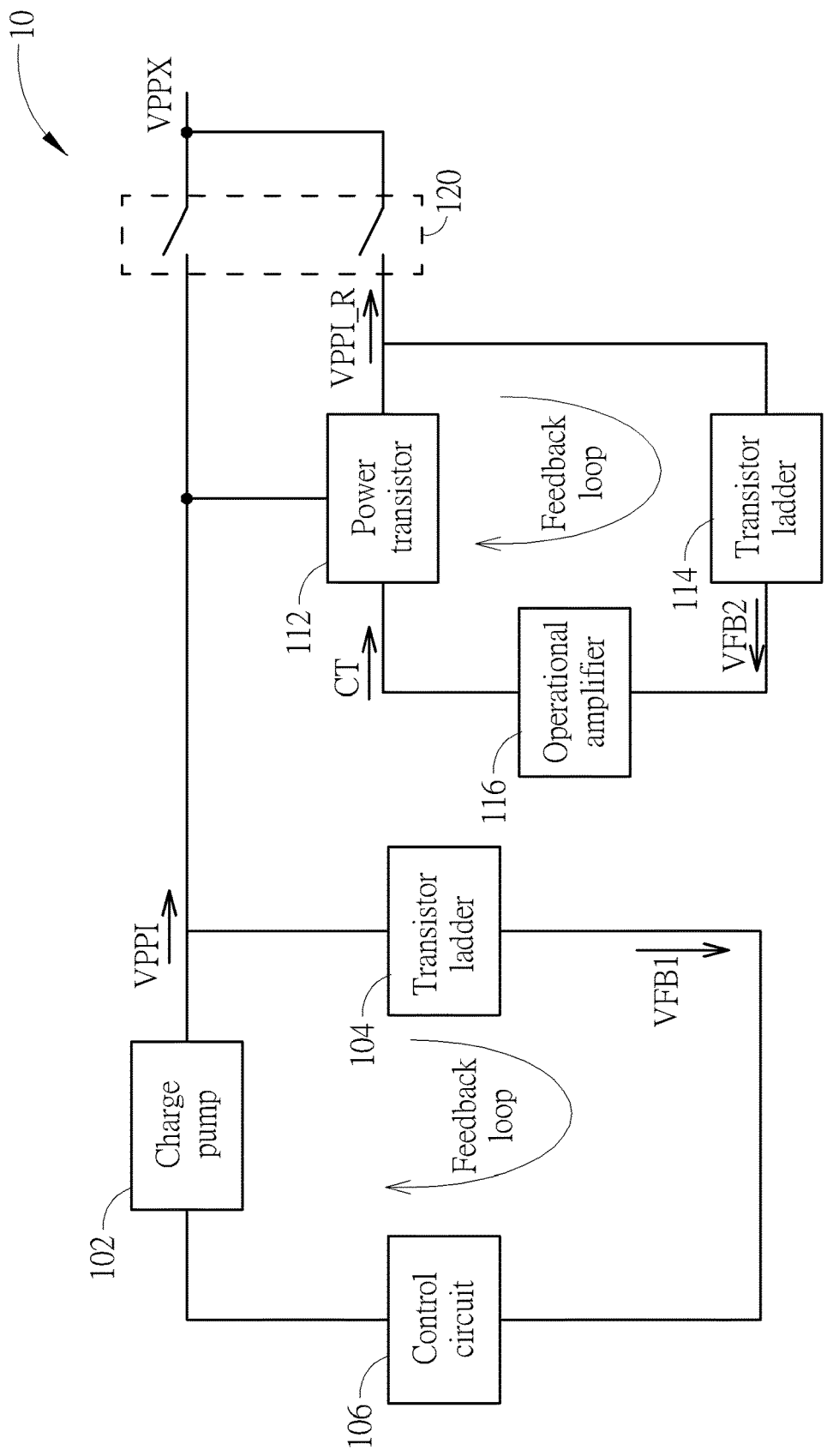
FIG. 1 is a schematic diagram of a voltage regulator according to an embodiment of the present invention.

Please refer to FIG. 1, which is a schematic diagram of a voltage regulator 10 according to an embodiment of the present invention. As shown in FIG. 1, the voltage regulator 10 is composed of two feedback loops. The first feedback loop includes a charge pump 102, a transistor ladder 104 and a control circuit 106. The second feedback loop includes a power transistor 112, a transistor ladder 114 and an operational amplifier 116. In this embodiment, an output voltage VPPI is outputted from the first feedback loop, and the power transistor 112 receives the output voltage VPPI and thereby generates an output voltage VPPI_R. The voltage regulator 10 further includes an output selector 120 for selecting to output one of the output voltages VPPI and VPPI_R.

In detail, in the first feedback loop, the charge pump 102 is configured to generate and output the output voltage VPPI. The transistor ladder 104, coupled to the charge pump 102, is configured to divide the output voltage VPPI to generate a feedback voltage VFB1. The control circuit 106, coupled to the transistor ladder 104, then receives the feedback voltage VFB1 and thereby controls the level of the output voltage VPPI according to the feedback voltage VFB1 and a reference voltage. The first feedback loop aims at providing the output voltage VPPI having a higher level.

In the second feedback loop, the power transistor 112 receives the output voltage VPPI to generate the output voltage VPPI_R. The transistor ladder 114, coupled to the power transistor 112, is configured to divide the output voltage VPPI_R to generate a feedback voltage VFB2. The operational amplifier 116, coupled to the power transistor 112 and the transistor ladder 114, then outputs a control signal CT to the power transistor 112 by receiving the feedback voltage VFB2 and a reference voltage. The control signal CT may be outputted to the gate terminal of the power transistor 112 to control the drain current of the power transistor 112, so as to regulate and control the output voltage VPPI_R to a desired level.

In this embodiment, the transistor ladders 104 and 114 replace the resistor ladders usually implemented in a conventional voltage regulator. Each of the transistor ladders 104 and 114 may include a plurality of transistors connected in series, to realize voltage division without the usage of any resistor. The transistor ladders 104 and 114 may generate less power consumption with the usage of a smaller circuit area in comparison of the commonly used resistor ladders.

Figure 2:
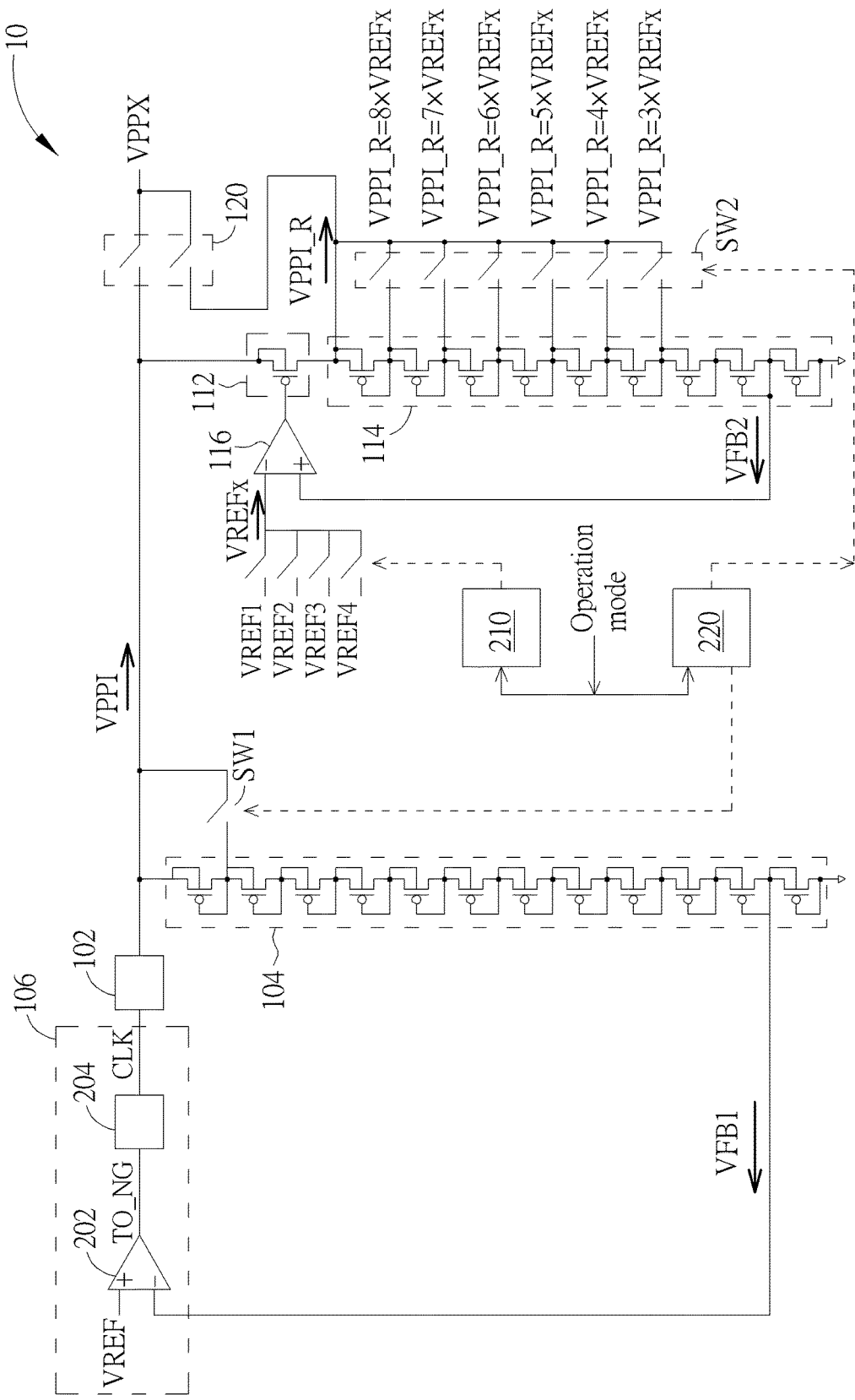
FIG. 2 is a schematic diagram of a detailed implementation of the voltage regulator.

Please refer to FIG. 2, which is a schematic diagram of a detailed implementation of the voltage regulator 10. As for the first feedback loop, there are 12 diode-connected PMOS transistors included in the transistor ladder 104. The transistor ladder 104 outputs the feedback voltage VFB1 from the source terminal of the bottommost transistor. A switch SW1 is connected between the source terminal and the drain terminal of the topmost transistor. The control circuit 106 includes a comparator 202 and a voltage controlled oscillator (VCO) 204. The comparator 202 receives the feedback voltage VFB1 via its negative input terminal and receives a reference voltage VREF via its positive input terminal, and generates a comparison signal TO_NG by comparing the feedback voltage VFB1 with the reference voltage VREF. The comparison signal TO_NG is served as a voltage signal which controls the frequency of an output clock signal CLK of the VCO 204. The clock signal CLK in turn controls the level of the output voltage VPPI boosted by the charge pump 102. The feedback control of the first feedback loop forces the feedback voltage VFB1 to be equal to the reference voltage VREF. In an embodiment, the reference voltage VREF is equal to 0.8V, and the output voltage VPPI may be equal to 0.8V×11=8.8V or 0.8V×12=9.6V based on the status of the switch SW1.

As for the second feedback loop, there are 9 diode-connected PMOS transistors included in the transistor ladder 114. The transistor ladder 114 outputs the feedback voltage VFB2 from the source terminal of the bottommost transistor. Several switches SW2 are connected to the source terminal of different transistors, to generate the output voltage VPPI_R having different levels based on the control of the switches SW2. In order to realize the adaptive level control of the output voltage VPPI_R, the voltage regulator 10 further includes a reference selector 210 and a ratio selector 220. The ratio selector 220 is configured to select the division ratio or the multiplication ratio of the transistor ladder 114 by controlling the status of the switches SW2. In addition, the reference voltage VREFx received by the operational amplifier 116 may be selected from one of a plurality of voltage levels. In this embodiment, there are 4 voltage levels VREF1-VREF4 to be selected, and the reference selector 210 may select the reference voltage VREFx from one of the voltage levels VREF1-VREF4. Therefore, the feedback control of the second feedback loop forces the feedback voltage VFB2 to be equal to the selected reference voltage VREFx, and the output voltage VPPI_R may be equal to the reference voltage VREFx multiplied by a multiplication ratio based on the status of the switches SW2.

In such a situation, the level of the output voltage VPPI_R may be determined by cooperation of the reference selector 210 (which selects the level of the reference voltage VREFx) and the ratio selector 220 (which selects the multiplication or division ratio of the transistor ladder 114). In this embodiment, one of 4 candidate voltage levels VREF1-VREF4 is selected by the reference selector 210, and the switches SW2 may control the output voltage VPPI_R to be equal to a level from threefold to eightfold the feedback voltage VFB2. Therefore, the combination may generate at most 24 different levels of the output voltage VPPI_R.

In the transistor ladder 114, the output level control is determined by the number of transistors and their wire connections and implementation of switches. To successfully realize the voltage division and multiplication, the gate-to-source voltage of each transistor should be greater than the transistor's threshold voltage, which may be near 0.7V-0.8V. Therefore, the feedback voltage VFB2 should be greater than the threshold voltage of the transistor, in order to ensure that the transistor ladder 114 can operate normally. In such a situation, the generated output voltage VPPI_R, which should be a multiple of the feedback voltage VFB2, is limited to certain levels due to the threshold voltage. In the present invention, the ratio selection of the transistor ladder 114 is further combined with the reference selection of the reference voltage VREFx, which leads to a more flexible control of the output voltage level, where more possible levels of the output power VPPI_R may be generated. As a result, the voltage regulator of the present invention will be more flexible and adaptive to various applications requiring a high range of voltage levels.

Please note that the first feedback loop generates the output voltage VPPI, which is boosted by the charge pump 102 to achieve a higher voltage level. The output voltage VPPI is served as a power supply voltage for the power transistor 112 of the second feedback loop; hence, the second feedback loop may generate and regulate the output voltage VPPI_R by receiving the output voltage VPPI from the charge pump 102. With the controls of the reference selector 210 and the ratio selector 220, the output voltage VPPI_R may be in a variety of levels lower than the level of the output voltage VPPI.

Preferably, the bulk terminal of each transistor in the transistor ladders 104 and 114 is connected to its source terminal, to reduce the influence of the body effect. Therefore, each transistor in a transistor ladder has an identical threshold voltage and therefore has an identical gate-to-source voltage, allowing the output voltage to be controlled precisely with the configured number of transistors and the connections of the transistor ladder and corresponding switches.

In an embodiment, the ratio selector 220 is further configured to select the division ratio or multiplication ratio of the transistor ladder 104 in the first feedback loop. As shown in FIG. 2, the switch SW1 is controlled by the ratio selector 220, allowing the charge pump 102 to generate the output voltage VPPI having different levels.

After the output voltages VPPI and VPPI_R are generated, the output selector 120 of the voltage regulator 10 may select to output one of the output voltages VPPI and VPPI_R as a final output voltage VPPX. With the controls of the reference selector 210, the ratio selector 220 and the output selector 120, the voltage regulator 10 is able to provide the output voltage VPPX having a wide range of levels. For example, a higher voltage level may be generated from the charge pump 102 in the first feedback loop, and a lower voltage level may be generated from the power transistor 112 and well controlled by the second feedback loop.

Therefore, the voltage regulator 10 of the present invention is applicable to a circuit element or module requiring a supply voltage with a wide range of levels such as a flash memory. The voltage regulator 10 may operate in different operation modes for generating different levels of output voltages. The operation mode of the voltage regulator 10 may be indicated by a host or a processor, or received from a user or tester via an external interface, based on the applications in the circuit element or module. According to the operation mode, the output selector 120 is controlled to select one of the output voltages VPPI and VPPI_R as the final output voltage VPPX. In addition, the selections of the reference selector 210 and the ratio selector 220 may also be controlled according to the operation mode of the voltage regulator 10. For example, with an application regarding the flash memory, the programming mode requires a supply voltage equal to 8.8V or 9.6V for the programming operation on a memory cell, and thus the output voltage VPPI with a higher level may be selected. For other operations such as the erasing operation, the voltage regulator 10 may output a lower voltage level which may be the output voltage VPPI_R generated from the second feedback loop.

Please note that the present invention aims at providing a voltage regulator which is capable of outputting a flexible output voltage having a wide range of levels without the usage of resistor ladders. Those skilled in the art may make modifications and alternations accordingly. For example, the detailed structure of the voltage regulator 10 shown in FIG. 2 is only one of various embodiments of the present invention. In detail, the quantity of transistors in the transistor ladder 104 or 114 may be disposed according to system requirements, which should not be a limitation of the scope of the present invention.

To sum up, the present invention provides a novel structure of voltage regulator, which is composed of two feedback loops. The first feedback loop includes a charge pump for generating a first output voltage with a higher level. The first output voltage is further served as a voltage supply for the power transistor in the second feedback loop. The power transistor thereby generates and regulates a second output voltage by receiving the first output voltage. Each feedback loop of the voltage regulator is formed by a transistor ladder. The combination of the selection of division ratio or multiplication ratio of the transistor ladder and the selection of the reference voltage provides a flexible output voltage without the usage of resistors. Therefore, the voltage regulator of the present invention has the benefits of low power consumption and smaller area, and the output voltage with high flexibility and high accuracy may be realized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage regulator, comprising:
   a first feedback loop, comprising:
      a charge pump, for outputting a first output voltage;
      a first transistor ladder, coupled to the charge pump, for dividing the first output voltage to generate a first feedback voltage; and
      a control circuit, coupled to the first transistor ladder, for receiving the first feedback voltage and controlling a level of the first output voltage according to the first feedback voltage and a first reference voltage; and
   a second feedback loop, coupled to the first feedback loop, comprising:
      a power transistor, for receiving the first output voltage to output a second output voltage;
      a second transistor ladder, coupled to the power transistor, for dividing the second output voltage to generate a second feedback voltage; and
      an operational amplifier, coupled to the second transistor ladder and the power transistor, for outputting a control signal to the power transistor by receiving the second feedback voltage and a second reference voltage selected from one of a plurality of voltage levels.

2. The voltage regulator of claim 1, wherein the control circuit comprises:
   a comparator, for generating a comparison signal by comparing the first feedback voltage with the first reference voltage; and
   a voltage controlled oscillator, for outputting a clock signal to control the level of the first output voltage according to the comparison signal.

3. The voltage regulator of claim 1, further comprising:
   an output selector, coupled to the first feedback loop and the second feedback loop, for selecting to output one of the first output voltage and the second output voltage according to an operation mode of the voltage regulator.

4. The voltage regulator of claim 1, further comprising:
   a reference selector, configured to select the second reference voltage to have one of the plurality of voltage levels according to an operation mode of the voltage regulator; and
   a ratio selector, configured to select a division ratio of the second transistor ladder according to the operation mode of the voltage regulator.

5. The voltage regulator of claim 4, wherein a level of the second output voltage is determined by cooperation of the reference selector and the ratio selector.

6. The voltage regulator of claim 4, wherein the ratio selector is further configured to select a division ratio of the first transistor ladder according to the operation mode of the voltage regulator.

7. The voltage regulator of claim 1, wherein the first output voltage is served as a power supply voltage for the power transistor, allowing the power transistor to generate and regulate the second output voltage, wherein the second output voltage is lower than the first output voltage.

8. The voltage regulator of claim 1, wherein the first transistor ladder divides the first output voltage and the second transistor ladder divides the second output voltage without the usage of a resistor.

9. The voltage regulator of claim 1, wherein the voltage regulator supplies the first output voltage and the second output voltage for a flash memory.

10. The voltage regulator of claim 9, wherein the first output voltage is supplied for a programming operation on the flash memory.

* * * * *